United States Patent [19] [11] 3,887,811
Livesay [45] June 3, 1975

[54] ELECTRO MECHANICAL ALIGNMENT APPARATUS FOR ELECTRON IMAGE PROJECTION SYSTEMS

[75] Inventor: William R. Livesay, Camarillo, Calif.

[73] Assignee: Radiant Energy Systems, Inc., Newbury Park, Calif.

[22] Filed: Nov. 8, 1973

[21] Appl. No.: 413,815

Related U.S. Application Data

[63] Continuation of Ser. No. 187,799, Oct. 8, 1971, abandoned.

[52] U.S. Cl. .............................. 250/442; 250/492 A
[51] Int. Cl. .............................................. H01j 37/20
[58] Field of Search .................. 29/578, 579; 156/2; 219/121 EB; 250/306, 307, 396, 398, 400, 440, 442, 491, 492 A; 310/8, 8.1, 8.5, 8.6, 9.4, 9.8

[56] References Cited

UNITED STATES PATENTS

| | | | |
|---|---|---|---|
| 3,225,226 | 12/1965 | Kawakami | 310/8.6 |
| 3,500,451 | 3/1970 | Yando | 310/8.5 |
| 3,648,048 | 3/1972 | Cahan et al. | 250/492 |
| 3,679,497 | 7/1972 | Handy et al. | 250/492 |

OTHER PUBLICATIONS

"Fabrication of Integrated Circuits using the Electron Image Projection System (ELIPS)" by T. W. O'Keeffe from IEEE Transactions on Electron Devices, Vol. Ed-17, No. 6, June 1970, pp. 465–469.

*Primary Examiner*—James W. Lawrence
*Assistant Examiner*—C. E. Church
*Attorney, Agent, or Firm*—Fulwider, Patton, Rieber, Lee & Utecht

[57] ABSTRACT

Electro mechanical alignment apparatus for electron image projection systems allowing the accurate angular alignment of an electron image on a wafer having initially large misalignment. The apparatus is comprised of piezoelectric crystals disposed so as to cause relative rotation between the photocathode mask and the wafer upon application of an electric signal. Various configurations are disclosed whereby substantially frictionless hysteresis free rotation of either the wafer or mask may be obtained in a manner compatible with the high vacuum environment of electron projection systems.

12 Claims, 11 Drawing Figures

WILLIAM R LIVESAY
INVENTOR.

BY Spensley, Horn & Lubitz
ATTORNEYS

WILLIAM R. LIVESAY
INVENTOR

BY Spensley, Horn & Lubitz
ATTORNEYS

WILLIAM R. LIVESAY
INVENTOR

BY Spensley, Horn & Lubitz
ATTORNEYS

ELECTRO MECHANICAL ALIGNMENT APPARATUS FOR ELECTRON IMAGE PROJECTION SYSTEMS

This is a continuation of application Ser. No. 187,799, filed Oct. 8, 1971, and now abandoned.

BACKGROUND OF THE INVENTION

1. Field of the Invention.

This invention relates to the field of electron image projection systems, and particularly such systems wherein very accurate alignment of the projected image with respect to reference marks on the wafer receiving the image is required.

2. Prior Art.

Electron image projection is now being used in certain fabrication applications, which heretofore used the older and more conventional photolithographic processes, because of certain inherent advantages in electron image projection over optical projection and contact printing processes. By way of example, in the fabrication of semiconductor devices, and particularly integrated citcuits, it is necessary to etch patterns in an oxide or other layers covering the semiconductor substrate at various stages of the processing of the substrate. Heretofore this has generally been done by coating the oxide layer with a photosensitive material and exposing the photosensitive material to a light source through a mask having the desired pattern thereon. The photosensitive material is then developed and either the exposed or the unexposed portion of the photoresist is dissolved away, depending upon the type of photoresist used, to expose the desired areas of the silicon oxide or other layer thereunder. In order to achieve the desired edge definition in the image in the photoresist, contact printing processes are generally used, with the mask physically and visually aligned with respect to the substrate to achieve the desired image placement. Such contact printing processes result in rapid mask wear and consequently the masks must be very frequently replaced in order to maintain the required image quality. Also, the physical and visual alignment of the mask with respect to the substrate is time consuming and subject to error.

Electron image projection has been used more recently on a limited basis to replace the older photolithographic processes where a high quality and finely detailed image is required, such as integrated circuit production. In such applications, the principal inherent advantages of electron image projection are better resolution, non-contact printing, and electrically controllable mask alignment. The higher resolution and the ability to achieve the required resolution through a non-contact printing process results from the fact that if electrons are emitted from a mask surface with a low energy level, and accelerated toward an electron resist on a substrate by a relatively high electric field, very little transverse electron scattering will occur, thereby resulting in a projected electron image of high quality and fine resolution. The alignment advantages result from the fact that electron beams may be readily deflected, either magnetically or electrostatically, so that the projected electron image may be readily rotated or translated by small amounts to accurately align the image with respect to the substrate.

Electron image production is achieved through the use of a mask adapted to emit electrons in a pattern from the surface of the mask. Typically, the mask is comprised of a quartz plate having a titanium dioxide mask surface deposited to one side of the plate and a thin layer of palladium deposited over the titanium dioxide mask. When the mask is illuminated from the back side with ultraviolet light, the palladium emits electrons with an energy of approximately 0.2 electron volts. Since the titanium dioxide masks the ultraviolet light from the palladium, only the area of the palladium not masked from the ultraviolet light by the titanium dioxide emits the electrons. The emitted electrons are then accelerated by an electric field to the electron resist coated substrate, typically through a voltage rise of perhaps 10,000 volts so that the 0.2 electron volts energy in the electrons, as emitted, will not result in excessive projected image degradation (loss in image sharpness due to lateral translation and dispersion of electrons during their time of travel to the surface of the electron resist).

Accurate physical alignment of the titanium dioxide mask with respect to the substrate or wafer would be extremely difficult, particularly since the electron image projection process must be carried out in a vacuum to avoid scattering of electrons from collisions with gas molecules. In the prior art, the mask is approximately physically aligned with respect to the substrate and the projected image is rotated, and/or translated, by electromagnetic means in small but readily controllable amounts so as to align the projected image on the wafer as desired. Various schemes are known for determining the proper deflection of the electron image in order to obtain the desired alignment such as, by way of example, the schemes disclosed and described in a co-pending application entitled "Alignment Method and Apparatus for Electron Projection Systems", Ser. No. 141,837, filed May 10, 1971, by Richard B. Fritz, et al assigned to the assignee of the present invention, both in the discussion of prior art and the detailed description of the invention of that application. One prior art method described therein is as follows: starting with a silicon wafer with a silicon-oxide layer covering the surface thereof, a star pattern is etched part way through the silicon-oxide layer near the edge of the wafer. Then, a thin layer of aluminum is deposited over the silicon-oxide surface in the star pattern and in the vicinity of the star pattern, and electrical contact is made to the layer of aluminum and to the silicon substrate. Also, each mask is adapted to project an electron image with a similar star pattern to the vicinity of the star pattern on the silicon-oxide layer on the substrate. The layer of aluminum is made extremely thin so that the projected electron image will substantially pass therethrough and into the silicon-oxide layer thereunder. Since electron bombardment of a silicon-oxide layer induces an electrical conductivity in the silicon-oxide which is inversely proportional to the thickness of the oxide layer, conductivity, as measured between the layer of aluminum and the silicon substrate, may be used as an indication of the position of the electron star pattern image on the masks with respect to the star pattern in the silicon-oxide layer. Thus, by imposing a voltage between the substrate and the layer of aluminum, the deflection of the electron image may be controlled so as to move the projected star pattern in accordance with the conductivity of the silicon-oxide layer. The conductivity of the oxide layer will be a maximum when the electron star pattern image is projected directly in alignment onto the star pattern etched part way through the silicon-oxide layer and thus, the deflection coils in the deflecting system are properly excited when both translational and rotational deflection perturbations result in a decrease in the conductivity of the oxide layer, as measured by the current flowing through the oxide layer between the aluminum layer and the substrate.

Electromagnetic deflection provides a convenient means for deflecting the electron image as desired since it is readily electrically controlled and provides the desired deflection without requiring mechanical motion of either the mask or the wafer to achieve alignment. However, the magnitude of the deflection that may be achieved by the electromagnetic means is limited, particularly in the amount the image may be rotated with respect to the wafer without significant defocusing of the image adjacent the edges thereof. The problem arises from the fact that to achieve linear rotation, a radially non-uniform. magnetic field is required and, in particular, the non-uniformity must be linear along a radius, increasing from a zero value at the center of the image. This means that for large diameter fields, the field changes from center to edge will be large for small rotations thus the problem is in maintaining resolution over a large diameter with a large enough rotation to correct for mechanical misalignment. Consequently, though mechanical alignment in the prior art system need not be as accurate as the ultimately required image alignment, still the mechanical alignment is required to be within limits not easily achieved within a vacuum system having various loading and unloading ports connected thereto for the regular processing of production quantities of wafers.

Linear translation of an electron image by a substantial amount, in contrast, is relatively easily obtained without substantial distortion by electromagnetic means. Therefore, the combination of electromagnetic translation of an electron image and the electromechanical rotation of the electron image would have specific advantages in regard to the range of deflection that might be achieved without causing distortion and de-focusing of the image. However, prior art systems have been limited to the use of electromagnetic deflection means, primarily because of the difficulty of achieving a low cost, substantially hysteresis free, electromechanical rotation scheme which is compatible with a vacuum environment, that is, which is free of lubricants, organic materials, small gaps, and the like, which would tend to contaminate the vacuum environment by constant out gassing. Thus, there is a need for an electromechanical means of rotating either the mask or the wafer in the electron image projection system which is mechanically simple, inexpensive, capable of rotation through significant angles in a manner readily controllable to a very small increment, and which is compatible with a high vacuum environment.

BRIEF SUMMARY OF THE INVENTION

Electromechanical alignment apparatus for electron image projection systems allowing the accurate angular alignment of an electron image on a wafer having initially large misalignment. The apparatus is comprised of piezoelectric crystals disposed so as to cause relative rotation between the photocathode mask and the wafer in response to an electrical signal. Various configurations are disclosed whereby substantially frictionless, hysteresis free rotation of either the wafer or mask may be obtained in a manner compatible with the high vacuum environment of electron projection systems. The various embodiments specifically described in detail use three crystal assemblies wherein each crystal assembly comprises an assembly of two piezoelectric crystals joined to a common intermediate conductor. In one embodiment, the crystal assemblies are mounted between the support for the photocathode and the support for the wafer on the faces of the crystal assemblies which are parallel to the intermediate conductor. The crystal orientations are chosen so that relative rotation between the photocathode and the wafer may be caused by electrically connecting the photocathode support to the wafer support and by applying a control voltage to the intermediate conductor with respect to the supports.

Other configurations disclosed utilize similar crystal assemblies which are mounted by their ends to the photocathode and wafer supports, with the intermediate conductor making electrical contact to both supports. The surface of each crystal between the two supports which is parallel to the intermediate conductor has an electrical contact thereon and the crystal orientations are chosen so that upon application of a control voltage between these last named conductive surfaces and the support, the crystal assemblies will assume a substantially uniform curvature in response thereto. By properly orienting the crystal assemblies and properly attaching the assemblies to the supports, there results an angular rotation of one support with respect to the other in response to a control voltage. Various embodiments incorporating crystal assemblies of this type are disclosed.

DETAILED DESCRIPTION OF THE INVENTION

The present invention is an electromechanical alignment apparatus for electron image projection systems utilizing piezoelectric phenomena to rotate either the photocathode mask or the semi-conductor wafer in response to an electrical signal derived from an automatic alignment system to achieve angular alignment of the electron image with respect to the wafer and, in conjunction with electromagnetic or other translation deflection means, complete alignment of the electron image to the wafer.

Figure 1:
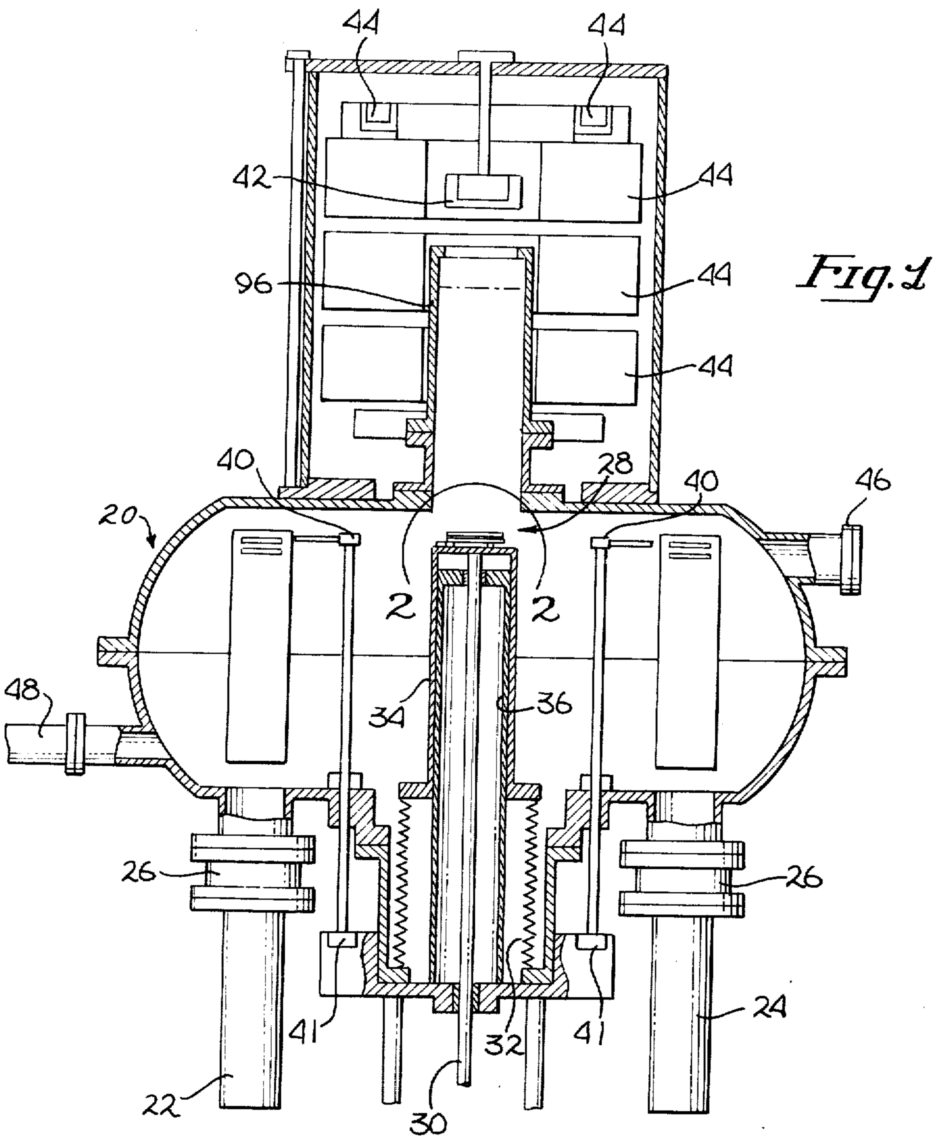
FIG. 1 is a partial cross-section of a typical electron image projection system.

First referring to FIG. 1, a partially cutaway view of a prior art electron image projection system may be seen. The projection system is comprised of a vacuum chamber generally indicated by the numeral 20, having a plurality of floating vestibules such as the wafer loading vestibule 22 and the cathode loading vestibule 24, separated from the vacuum chamber by gate valves 26 so that wafers and cathodes may be placed in the vestibules, the vestibules evacuated, and the gate valves opened so that the wafers and cathodes may be passed into the vacuum chamber. A central platform, generally indicated by the numeral 28, is adapted for vertical motion through a drive rod 30, with a bellows 32 disposed so as to provide a hermetic seal and yet allow a vertical motion. A cylindrical member 34 slides on an inner member 36 to guide the platform 28 and to connect the platform area to bellows 32. A pair of transfer mechanisms 40 operated by handles 41 may be used to transfer the wafers and cathodes to and from the central platform 28. Mounted above the main vacuum chamber is an ultraviolet light source 42 and focusing and deflection coils 44. Thus, when the drive rod 30 is extended to push platform 28 upward into the upper portion of the system, ultraviolet light source 42 is disposed so as to illuminate the photocathode at the top of platform 28. The photocathode emits electrons which are accelerated to the wafer below the photocathode through a high voltage drop, and are focused and aligned by the coils 44 so as to impinge upon the wafer in the desired pattern and with the required resolution and alignment. A viewing port 46 is provided so that the operator may visually follow the loading and unloading process, and a vacuum connection 48 is provided to constantly maintain the high vacuum in the chamber.

Figure 2:
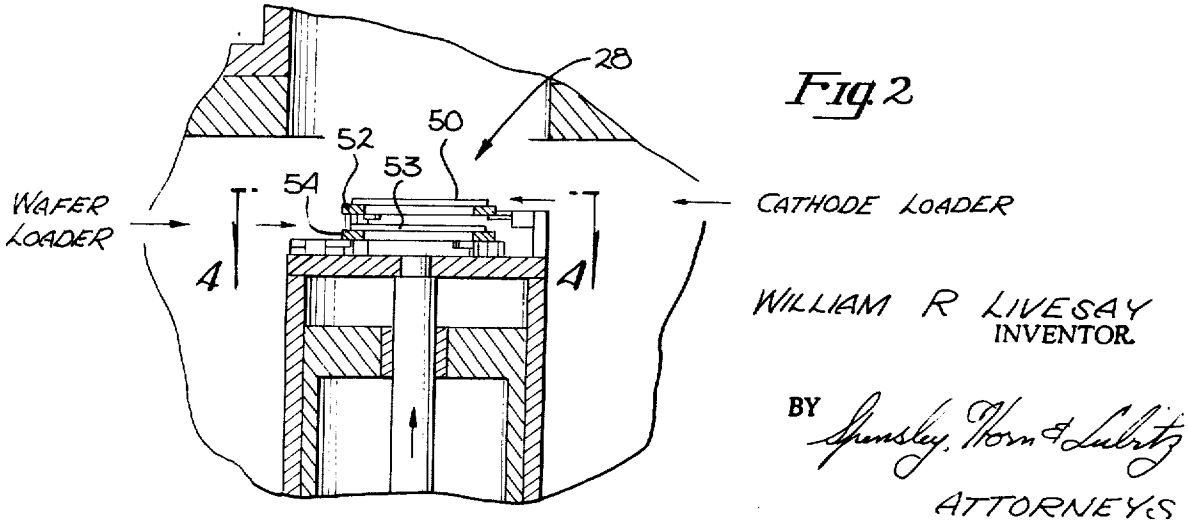
FIG. 2 is a partial cross-section taken on an expanded scale of the photocathode and wafer supports and the platform on which they are mounted in the electron image projection system of FIG. 1.

Now referring to FIG. 2, more of the details of platform 28 may be seen. The photocathodes 50 are loaded from the right and are placed on a platform 52, which are adapted to receive the photocathodes. The wafers 53 are loaded from the left and are placed on a platform 54 located below platform 52 so that the electron image projected by the photocathode will impinge on the wafer as desired. In the manufacture of semiconductor devices, and particularly integrated circuits, each wafer will be coated with photoresist and be exposed through a mask three or more times during the processing, and it is necessary that the various mask patterns are accurately aligned with respect to each other on the wafer. The wafers and the photocathodes may be loaded into platform 28 with reasonable initial accuracy, that is, to within a few thousandths of an inch in translational position and within a fraction of a degree in rotational position by using such alignment methods as alignment pins indexing on suitable holes in the wafers, etc. However, alignment to within one micron or less is required of such equipment.

As hereinbefore described, methods are known for detemining the misalignment between the wafers and the photocathodes and for deflecting the electron image so as to correct for this misalignment. Translational correction is readily achieved, whereas very little angular misalignment may be corrected without causing distortion and defocusing of the image at and near the periphery of the wafer. In this present invention system, it is presumed that the translational misalignment between the wafer and the photocathode is accomplished by prior art methods such as, by way of example, suitable deflection coils disposed about the system which will translate the image as required.

Figures 3, 4, 5:
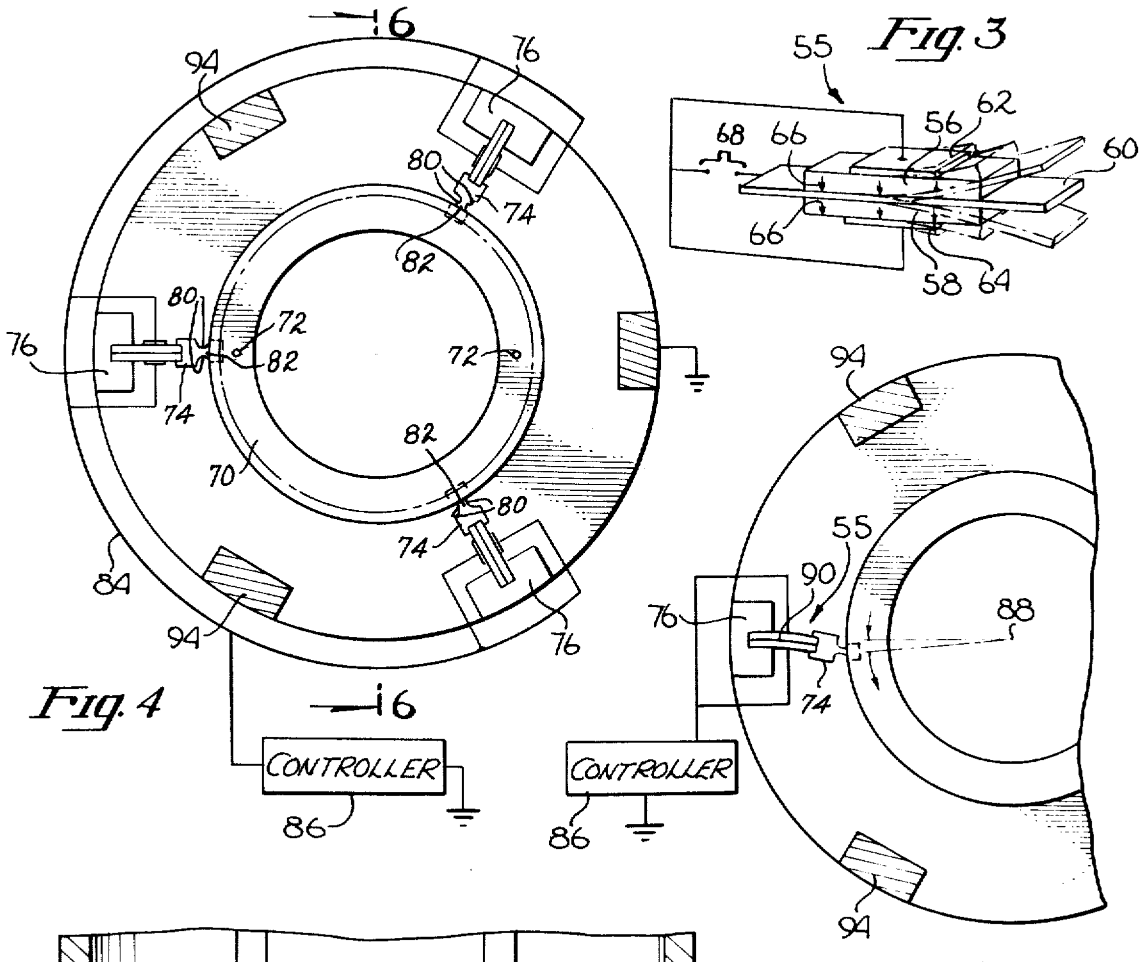
FIG. 3 is a perspective view of a crystal assembly used in various embodiments of the present invention.
FIG. 4 is a top view, in partial cross-section, of the angular alignment apparatus of the present invention.
FIG. 5 is a top view of the angular alignment apparatus of the present invention, shown in partial cross-section, illustrating the rotation of the support ring in response to the curvature of the crystal assemblies.

Now referring to FIG. 3, a perspective view of a piezoelectric crystal assembly 55 may be seen. This assembly is comprised of two piezoelectric crystals 56 and 58 bonded to a central metallic strip 60, with each crystal having contact plates 62 and 64 on opposite surfaces of the assembly. The arrows on the face of the two crystals generally indicated by the numerals 66, indicate the direction of polarization of the crystals. It will be noted that the voltage applied at terminals 68 provides an electric field between the contact plate and the metallic strip, for the two crystals, which is equal in voltage but opposite in direction with respect to polarization of the crystals. In response to this voltage, one crystal will increase in length while the other crystal will decrease in length. This will cause the crystal assembly to assume a curved condition, the direction of which is dependent upon the polarity of the voltage, and the amplitude of which is dependent upon the amplitude of the voltage. Thus, the voltage applied at terminal 68 may be used to cause a controlled bending of the crystal assembly. The two contact plates 62 and 64 are somewhat shorter than the crystals to which they are attached so that a portion of the bare crystals 56 and 58 is left at each end of each crystal.

Now referring to FIG. 4, a top view of platform 28 along lines 4—4 of FIG. 2 may be seen. The top of the platform comprises a ring 70 having a pair of alignment pins 72 thereon and projecting upward to engage, and provide course alignment for, the photocathode. Attached to the lower surface of the ring and projecting radially outward are three flexure members 74, which engage the end of one of the crystal assemblies 55 on the metallic strip 60 and on the ends of the two crystals 56 and 58 so as to not make electrical contact with contact plates 62 and 64. The other end of each of the crystal assemblies is attached to a post 76, which provides vertical support to dispose ring 70 at the desired vertical position above a similar support ring 78 for a semiconductor wafer.

The flexure member 74 is rigidly attached to ring 70 and has a region of reduced thickness defined by relieved areas 80 so as to create a flexible portion 82 therebetween, that is, a region of reduced stiffness to bending about an axis parallel to the ring 70. The outer end of the crystal assembly 55 is rigidly attached to the post 76 and metallic strip 60 of each crystal assembly is electrically connected both to ring 70 and one of posts 78.

Electrical contact is made to each of the contact plates 62 and 64 through line 84, which is connected to controller 86. Since the structure of the platform is grounded by the central metallic strip 60 of each of crystal assemblies 55, which are attached both to the main platform structure and to the ring 70, all structure of the assembly is grounded except for the contact plates 62 and 64 and the crystals thereunder. The crystal assemblies 55 are disposed in such a manner that the inner end of all the crystal assemblies will deflect in unison, either in a clockwise direction or a counterclockwise direction, depending upon the voltage applied to the crystals on line 84 from the controller 86. Thus, as may be seen in FIG. 5, when a voltage is applied by controller 86, the crystal assemblies will assume a curved characteristic, each translating the periphery of ring 70 in the direction substantially tangent to the diameter of the ring, and therefore together rotating the ring in response to the voltage applied by controller 86. Since the outer end of each of the crystal assemblies is rigidly attached to one of posts 76, whereas the inner end of the crystal assemblies are attached to the ring 70 through a flexure member 74, the inner end of the crystal assembly is free to assume an angle with respect to the radius of the ring 70, so that the deflection of the crystal causes rotation of the ring as shown in FIG. 5. In this manner, rigid and accurate support for the photocathode is obtained, while accurate, angular alignment through a simple voltage control may be achieved without the use of bearings, sliding members and the like. In the preferred embodiment, controller 86 comprises the automatic alignment system disclosed in the co-pending application entitled "Alignment Method and Apparatus for Electron Projection Systems", Ser. No. 141,837, filed May 10, 1971, by Richard B. Fritz, et al, assigned to the assignee of the present invention, the electromechanical alignment apparatus of the present invention being substituted for the electromagnetic deflection means described therein.

The maximum motion that may be achieved by the use of piezoelectric crystals, as shown in FIG. 4, and particularly the scale factor of the motion in terms of angular units per volt, depends upon a number of factors. In order to achieve the desired amplitude of motion, the crystals must be of sufficient length and proportion to give the desired amplitude. The scale factor, while being dependent on the crystal size and proportions, is also dependent upon the manner of connection of the various crystals. By way of example, it will be noted in FIG. 3 that the full voltage applied at terminals 68 is imposed across each of crystals 56 and 58, and that each crystal assembly in FIG. 4 is connected in parallel to the output voltage of controller 86, so that full controller voltage is imposed across each and every crystal in each of the three crystal assemblies in the system.

The piezoelectric angular alignment system of FIG. 4 may be used either for the wafer support or for the photocathode support. However, since one wafer will not be exposed to any more than one photocathode before being removed from the system for developing and further processing, while a number of wafers are apt to be exposed by any one photocathode, it is preferable to provide the piezoelectric angular alignment system for the photocathode support, that is, the support which may be expected to receive less physical abuse because of the potentially less frequent changes of the item supported and aligned thereby.

When a voltage of a first polarity is applied to each of the crystal assemblies 55 by controller 86, the crystal assembly in the region between contact plates 62 and 64 will bend with a substantially uniform curvature, the amplitude of which is dependent upon the amplitude of the voltage. Since the outer end of the crystal assembly is rigidly attached to one of posts 76, whereas the inner end is attached to the ring 70 through flexure member 74, the inner end may change its angular orientation with respect to the ring. Thus, the crystal assembly 55 will curve as shown in FIG. 5, with the flexure member 74 bending as shown so as to effectively cause translation of the attachment point on the ring. The crystal assemblies are arranged in a circular pattern with respect to their attachment to the ring 70 and their attachment to the post 76, and are connected in circuit so that a voltage of a specific polarity causes a deflection of the inner end of all crystal assemblies in the same circumferential direction around the inner ring. This causes a rotation of the inner ring about its central axis 88 and thus results in the desired angular motion.

It is apparent from FIG. 5 that as the ring 70 rotates, the attachment point on the ring for the flexure member 74 tends to curve about a first axis, that is, axis 88, whereas the inner end of crystal assembly 55, if otherwise unrestrained, would tend to curve or rotate about a second axis located approximately one-half way along the length of the crystal assembly 55 at point 90. Thus, if the crystal assembly were not attached to the ring 88 there would be some radial motion between the crystal assembly and the ring as the ring rotated and the crystal assembly assumed a substantial curvature. However, since these members are attached to each other there results a longitudinal stress along the crystal assembly and through the flexure as the ring 70 rotates. However, the amplitude of this stress is limited because of the limited angular motion that results, and may be further reduced by designing the various support members for the crystal so as to allow at least some elasticity in the radial direction.

Figure 6:
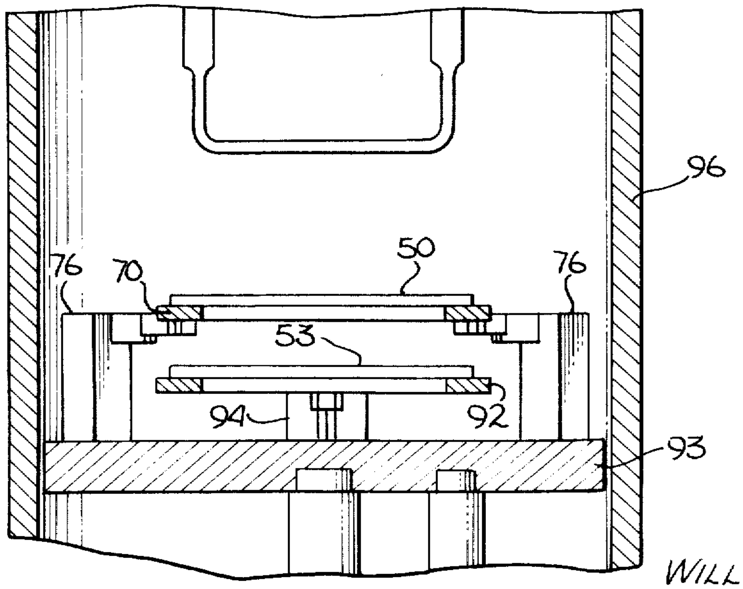
FIG. 6 is a side view in partial cross-section of the electromechanical alignment apparatus of FIG. 4 taken along line 6—6 of that figure.

Now referring to FIG. 6, a side view of the platform taken along lines 6—6 of FIG. 4 may be seen. The wafer 53 is supported by a ring 92 which is adapted to cooperate with the wafer to provide initial course alignment such as, by way of example, by locating pins in the ring 92 to engage appropriately disposed holes in the wafer. The ring 92 in turn is supported by posts 94 (FIGS. 4 through 6) which extend only upward to the bottom of ring 92 and do not interfere with the free passage of wafer 53 between two of posts 86 for disposition on the ring 92. The entire assembly of rings 70 and 92 and of the associated support structure is located on plate 94 of the central platform, generally indicated by the numeral 28 in FIG. 1. The platform is shown in FIG. 6 in the raised position so as to dispose the platform within tubular chamber 96 just below ultraviolet light source 42 for exposure of the wafer through the photocathode mask 50.

Figures 7, 8, 9:
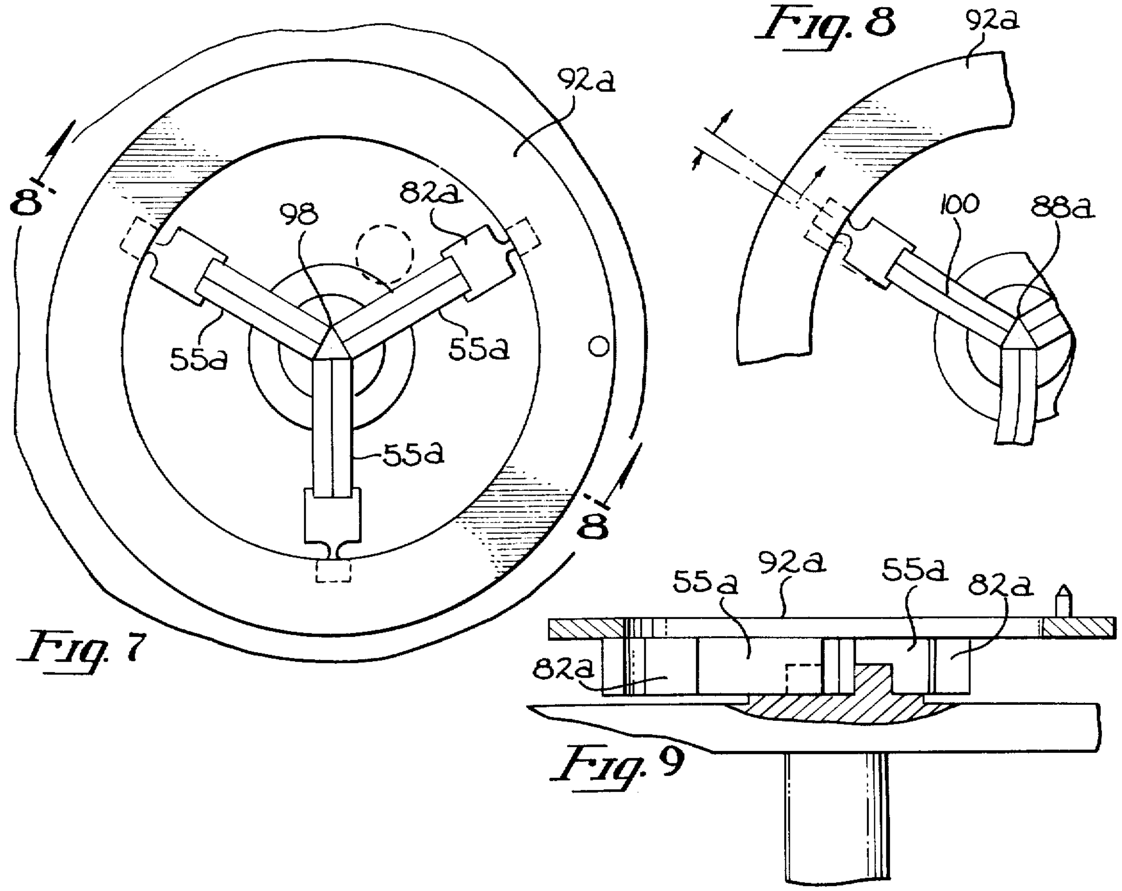
FIG. 7 is a top view of an alternate embodiment of the present invention alignment system.
FIG. 8 is a top view of a portion of the alignment system of FIG. 7 illustrating the rotation of the support ring.
FIG. 9 is a side view of the alignment apparatus of FIG. 7.

Now referring to FIG. 7, 8 and 9, an alternate embodiment of the present invention for rotation of the wafer 53, rather than the photocathode mask 50, may be seen. In this embodiment, the wafer support ring *92a* is attached through flexure members *82a* to the crystal assemblies *55a*, which are disposed so as to be directed radially inward and are attached to a central support structure 98. The electrical connection of the crystals and the operation of the flexure members is substantially the same as that shown in the previous embodiment. This embodiment, however, has certain advantages in certain applications. By way of example, it will be noted that no structure is required which has a diameter greater than the ring *92a*, so that wafers approaching the full diameter of chamber 96 (FIG. 1) may be used with this alignment system. Also, the center *88a* of the support ring $92a$ is closer to the effective center of rotation 100 of the crystal assemblies $55a$ so as to generally result in a lower radial stress in the crystal assemblies for a given angular deflection.

It should be noted that in both of the previously described embodiments, the crystal assemblies are located in a substantially horizontal position, that is, the attachments to both ends of the crystal assembly are generally located in the same plane. As a further alternate embodiment, the crystal assemblies may be disposed in a substantially vertical orientation with the attachment of the crystal assemblies to a support ring, such as the photocathode support ring, the crystal assemblies generally being located above or below the attachment point of the crystal assemblies to the stationary portion of the platform. In such an embodiment, the crystal assemblies neither require space and structure at diameters substantially larger than the support ring, nor obstruct the central area of the support ring so as to obstruct the ultraviolet light or the electron image.

Figure 10:
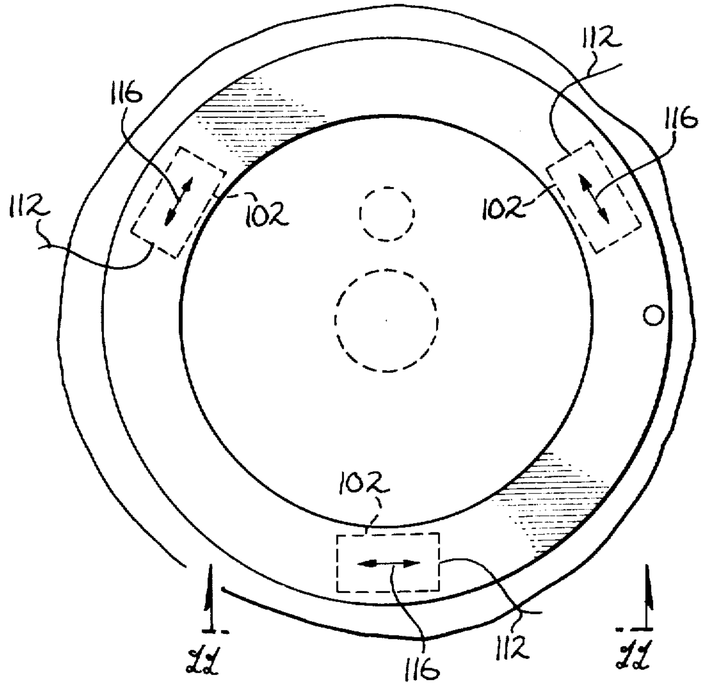
FIG. 10 is a top viw of a further alternate embodiment of the present invention.
Figure 11:
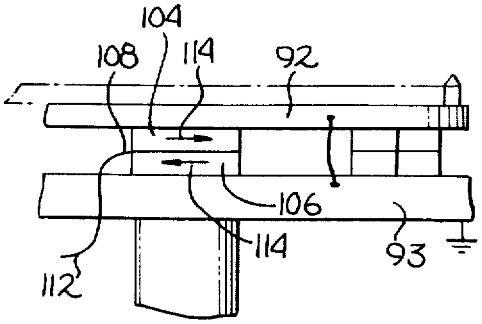
FIG. 11 is a side view of the alignment apparatus of FIG. 10.

While the above-described alternate embodiment may be designed to use crystal assemblies, such as crystal assembly 55, a different type of crystal assembly as shown in FIGS. 10 and 11 may be used. In this embodiment, the crystal assemblies, generally indicated by the numeral 102, are comprised of a pair of crystals 104 and 106 mounted to a central metalic strip 108, and on their outer surfaces to the wafer support ring 92 and the plate 93. A ground wire 110 is connected between ring 92 and plate 93, and the plate 93 in turn is grounded so that all the structure is at ground potential, except for central metallic strip 108 which may be connected through lead 112 to a controller, such as controller 86 in FIG. 4. Three crystal assemblies are used in this embodiment, again disposed in a circular pattern. The polarization of each of the crystals is indicated by the arrow 114 in FIG. 11 and is chosen so that application of a voltage to the central metallic strip 108 will cause the top surface of the crystal assembly to translate in a generally tangential direction, as indicated by the arrow 116 in FIG. 10. Thus, by proper orientation of the crystals, the ring may be caused to rotate about its central axis in response to a control voltage applied through lead 112 on each crystal.

There has been described herein a number of embodiments of an angular alignment system for electron image projection systems which is compatible with a high vacuum environment, is substantially friction-free and is readily controllable with an electrical signal. The various embodiments disclosed do not require voltage differences, and particularly varying voltage differences, between substantial portions of the structure, and thereby minimize electrostatic influence of the electron image by the control voltage. Of course, electrostatic shielding is easily achieved, and electrostatic effects on the image from this source are easily reduced to negligible levels. Though only certain embodiments of the present invention have been particularly shown and described, it will be understood by those skilled in the art that various changes in form and details may be made therein without departing from the spirit and scope of the invention.

I claim:

1. An angular alignment system for electron image projection systems comprising:

first means for supporting a photocathode;

second means for supporting an article to receive an electron image emitted from the photocathode; and a plurality of piezoelectric means disposed between and attached to said first and second means, for inducing relative rotation between said first and second means according to the magnitude and polarity of a control voltage applied to said piezoelectric means to cause dimensional distortion thereof, and for providing the sole support for the weight of one of said first and second means with respect to the other, thereby allowing substantially friction-free and hysteresis-free relative rotation.

2. The system of claim 1 wherein said piezoelectric means comprises a plurality of piezoelectric elements each having first and second surfaces, each of said piezoelectric means being attached to said first means by said first surface and to said second means by said second surface, said first surfaces generally being equally spaced about the circumference of a first circle, said second surfaces generally being equally spaced about the circumference of a second circle, said first and second circle being concentric, said piezoelectric means being adapted to cause said second surfaces to move with respect to said first surface in a direction substantially tangentially to the circumference of said second circle.

3. An angular alignment system for electron image projection systems comprising:

first means for supporting a photocathode;

second means for supporting an article to receive an electron image in functional disposition with respect to said photocathode; and a plurality of piezoelectric means each having first and second ends attached to said first and second means respectively, said piezoelectric means being responsive to a control voltage to cause relative rotation between said first and second means by the resulting curvature along the length of said piezoelectric means;

and wherein said piezoelectric means provide sole support for the weight of one of said first and second means and transfer it to the other of said first and second means, thereby allowing substantially friction-free and hysteresis-free relative rotation between said first and second means in accordance with the magnitude and polarity of the control voltage.

4. The system of claim 3 wherein said plurality of piezoelectric elements comprises three elements.

5. The system of claim 4 wherein said piezoelectric elements each have electrical contacts at first and second surfaces and at least one intermediate electrical contact, said piezoelectric elements being responsive to a control voltage applied between said intermediate electrical contacts and said contacts at said first and second surfaces.

6. The system of claim 5 wherein said first and second means each further includes an indexing means to provide an initial alignment of said photocathode with respect to said first means and said article with respect to said second means.

7. An angular alignment system for electron image projection systems comprising a plurality of piezoelectric crystal assemblies, each of said crystal assemblies having first and second ends defined by a pair of substantially rectangular crystals each with first and second parallel sides, said crystals in each of said crystal assemblies being joined on said first sides to opposite sides of a first conductive member, each crystal further having a second conductive member on said second surface and extending over the central area of said second surface, said first end of each of said crystal assemblies being mechanically coupled to a member adapted to receive an article to be exposed to an electron image, said second end of said crystal assemblies being mechanically coupled to a member adapted for receiving a photocathode, said first ends of said crystal assemblies being substantially equally spaced about the circumference of a first circle, said second ends of said crystal assemblies being substantially equally spaced about the circumference of a second circle concentric to said first circle, said crystal assemblies being adapted to cause relative rotation between said member adapted to receive a photocathode in response to control voltages applied between said first conductive member and said second conductive members of said crystal assemblies causing curvature of said crystal assemblies along the length thereof.

8. The angular alignment system of claim 7 wherein said first conductive member is electrically coupled to said member adapted to receive an article and to said member adapted to receive a photocathode.

9. The angular system of claim 8 wherein said second conductive members are electrically coupled to a terminal so that a control voltage may be applied between said terminal and said first conductive members to cause a controlled relative rotation between said member adapted to receive an article and said member adapted to receive a photocathode.

10. An angular alignment system for electron projection systems comprising:

first means for supporting a photocathode;

second means for supporting an article to receive an electron image in facingly disposed functional disposition with respect to said photocathode, one of said first and second means being a light weight ring-like member having first mounting means in a first circular pattern for attachment to a symmetrical arrangement of piezoelectric means;

a central mounting means coupled to the other of said first and second means, said central mounting means having a second mounting means for attachment to a symmetrical arrangement of piezoelectric means about a second circular pattern having a diameter which is a small fraction of the diameter of said first circular pattern, and a plurality of piezoelectric means each extending in a generally radial direction and coupled between said first and second mounting means to form a symmetrical arrangement of piezoelectric means providing the sole support for the weight of one of said first and second means with respect to the other and for providing relative rotation between said first and second means according to the magnitude and polarity of a control voltage applied to said piezoelectric means.

11. The angular alignment system of claim 10 wherein each said piezoelectric means has a radial length between said first and second circular pattern which exceeds the thickness of said piezoelectric means, each said piezoelectric means including means for applying voltages thereto to encourage curvature of each of said piezoelectric means in planes parallel to said ring-like member.

12. The angular alignment system of claim 10 wherein the number of piezoelectric means is three.

* * * * *